(12) United States Patent
Shaarawi et al.

(10) Patent No.: US 7,585,616 B2
(45) Date of Patent: *Sep. 8, 2009

(54) METHOD FOR MAKING FLUID EMITTER ORIFICE

(75) Inventors: Mohammed S. Shaarawi, Corvallis, OR (US); Thomas R. Strand, Corvallis, OR (US); Jeremy Harlan Donaldson, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 917 days.

This patent is subject to a terminal disclaimer.

(21) Appl. No.: 11/047,454

(22) Filed: Jan. 31, 2005

(65) Prior Publication Data

US 2006/0172227 A1 Aug. 3, 2006

(51) Int. Cl.
*B41J 2/16* (2006.01)
(52) U.S. Cl. .................. 430/320; 30/330; 30/394
(58) Field of Classification Search .............. None
See application file for complete search history.

(56) References Cited

U.S. PATENT DOCUMENTS

| | | | |
|---|---|---|---|
| 4,007,464 A | 2/1977 | Bassous et al. | |
| 4,066,491 A | 1/1978 | Ruh et al. | |
| 4,157,935 A | 6/1979 | Solyst | |
| 4,169,008 A | 9/1979 | Kurth | |
| 4,863,560 A | 9/1989 | Hawkins | |
| 4,877,717 A * | 10/1989 | Suzuki et al. | 430/321 |
| 5,375,326 A | 12/1994 | Usui et al. | |
| 5,451,993 A | 9/1995 | Takahashi et al. | |
| 5,459,003 A * | 10/1995 | Ota | 430/22 |
| 5,560,837 A | 10/1996 | Trueba | |
| 5,686,224 A | 11/1997 | O'Neill | |
| 5,706,039 A | 1/1998 | Chamberlain et al. | |
| 6,162,589 A | 12/2000 | Chen et al. | |
| 6,290,331 B1 | 9/2001 | Agarwal et al. | |
| 6,303,042 B1 | 10/2001 | Hawkins et al. | |
| 6,310,641 B1 | 10/2001 | Mrvos et al. | |
| 6,520,628 B2 | 2/2003 | McClelland et al. | |
| 6,527,370 B1 | 3/2003 | Courian et al. | |
| 2003/0137561 A1 | 7/2003 | Conta et al. | |
| 2005/0059256 A1* | 3/2005 | Watanabe | 438/725 |
| 2005/0130075 A1* | 6/2005 | Shaarawi et al. | 430/322 |

FOREIGN PATENT DOCUMENTS

JP 3286870 12/1991
JP 6134994 A 5/1994

* cited by examiner

*Primary Examiner*—John A. McPherson

(57) ABSTRACT

A method of forming a tapered bore an orifice layer of a photo-resist comprises forming a lens in a surface of a first unexposed portion of the layer and exposing the first unexposed portion through a bore-hole mask to define an exposed portion and a second unexposed portion, wherein the second unexposed portion has a tapered shape. The layer is baked to cross-link the exposed portion and developed to remove the second unexposed portion to form a tapered bore hole. The tapered bore hole has a shape corresponding to the tapered shape.

29 Claims, 7 Drawing Sheets

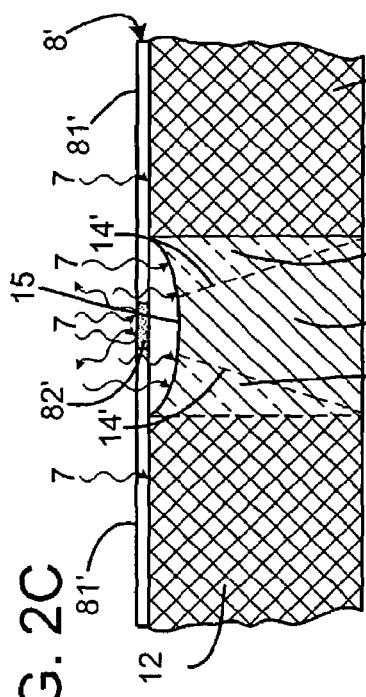
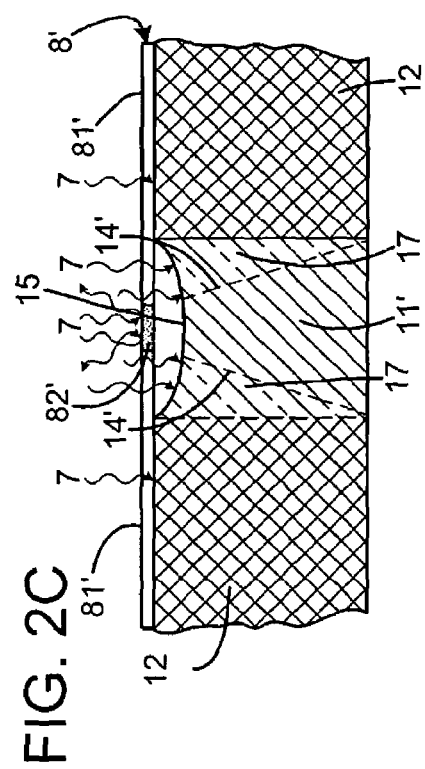
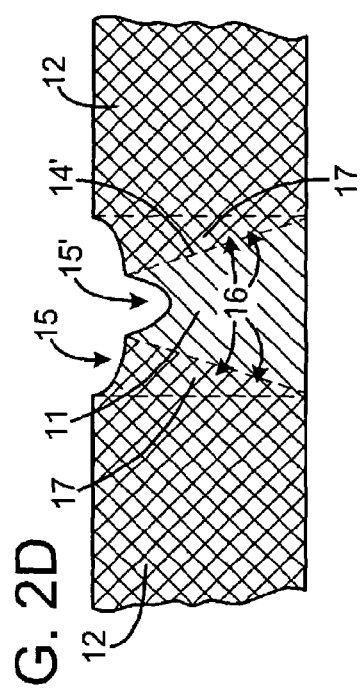
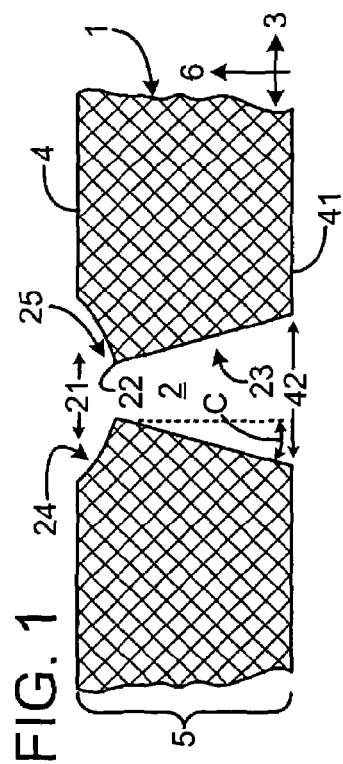
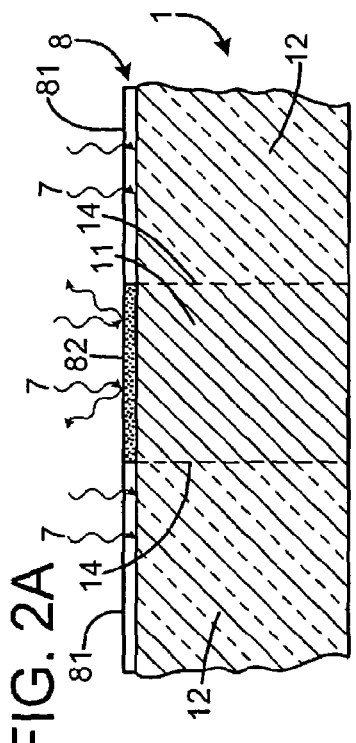
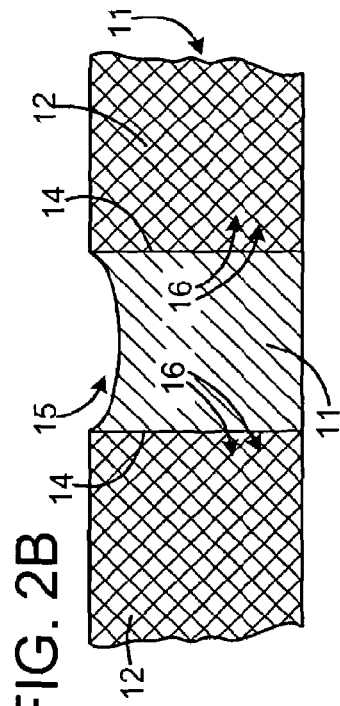

Elliptical Lens Shape Along Major and Minor Diameters

METHOD FOR MAKING FLUID EMITTER ORIFICE

RELATED APPLICATIONS

This Application is related to a U.S. patent application Ser. No. 10/734,328, filed Dec. 12, 2003, by Shaarawi et al. and entitled Method for Making Fluid Emitter Orifice.

BACKGROUND OF THE DISCLOSURE

Photo-resist etching may be used to create micro-structures in micro-electronic devices. For example, photo-resist etching is used to create micro-fluidic chambers, including ink manifolds and firing chambers, in a barrier layer of a fluid ejector such as an ink-jet print head. Photo-resist etching is used to form nozzles or fluid-transfer bores in an orifice layer arranged above the barrier layer of an ink-jet print head.

BRIEF DESCRIPTION OF THE DRAWINGS

Features and advantages of the invention will be readily appreciated by persons skilled in the art from the following detailed description of exemplary embodiments thereof, as illustrated in the accompanying drawings, in which:

FIG. 1 illustrates a cross-sectional view of an exemplary embodiment of a layer of photo-resist having a tapered borehole.

FIGS. 2A through 2D illustrate an exemplary embodiment of a process for forming a tapered bore hole such as the one shown in FIG. 1.

DETAILED DESCRIPTION OF THE DISCLOSURE

Figure 3:
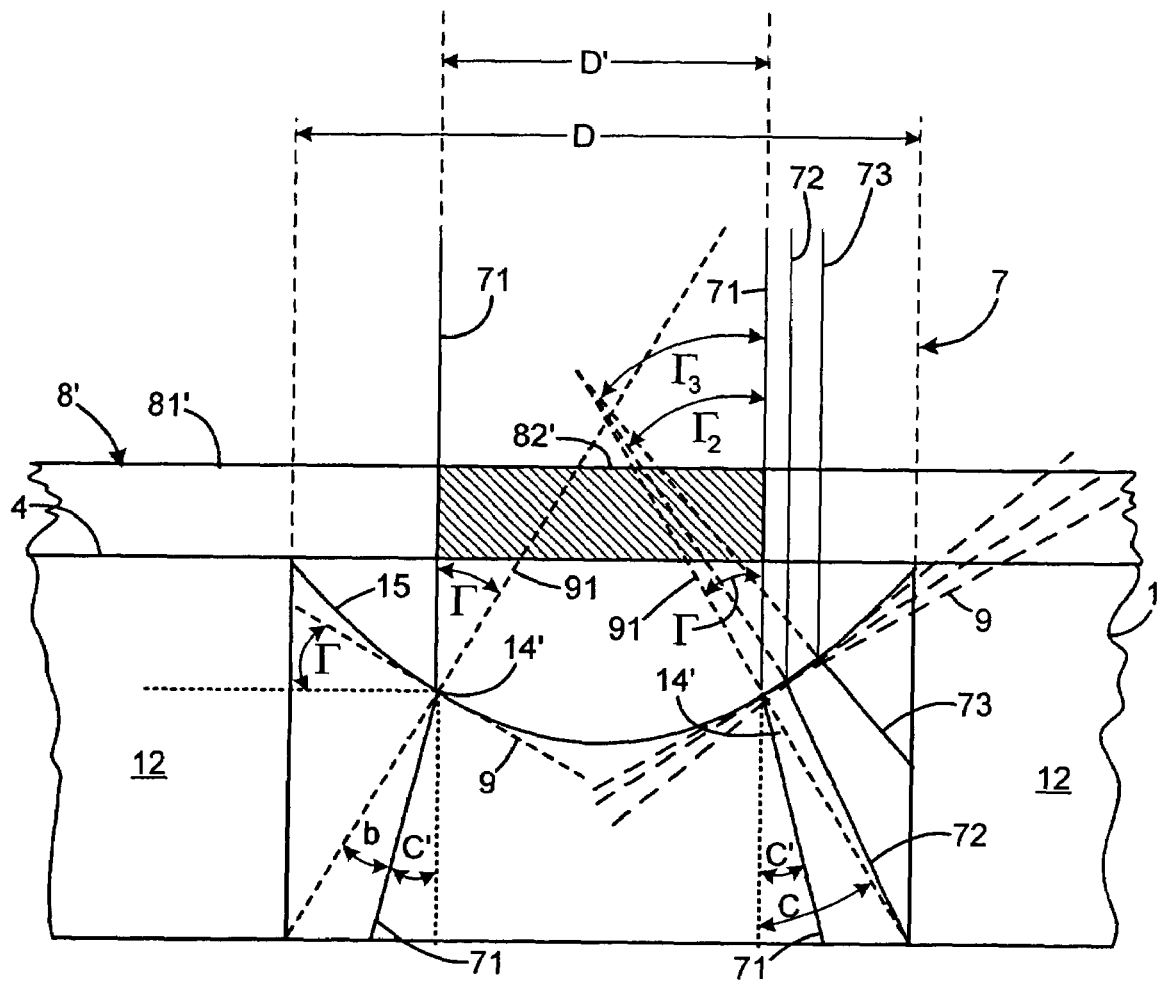
FIG. 3 illustrates an exemplary embodiment of a lens formed in a surface of a layer of photo-resist.

In the following detailed description and in the several figures of the drawing, like elements are identified with like reference numerals.

FIG. 1 illustrates an exemplary embodiment of a tapered bore hole 23 in a layer 1 of photo-resistive material. In an exemplary embodiment, a layer 1 of cross-linked photo-resist has a void 2, extending from the surface 4 of the layer to a surface 41 of the layer. The layer 1 of photo-resistive film may be arranged horizontally in an x-y plane, the x direction of which is shown by the arrow 3, and has a thickness in the z-axis 6.

The void 2 may be formed by an exemplary embodiment of a photo-resist etch process and may have an upper portion 24, a medial portion 22 and a lower portion 23. An upper surface opening 21 of the void 2 may have a cross-sectional area in the horizontal x-y plane, which is larger than the cross-sectional area in an x-y plane of a medial portion 22 of the void 2.

In an exemplary embodiment, the upper portion 24 of the void may be considered as extending from the narrower, medial portion 22 to the surface opening 21. In an exemplary embodiment, the upper portion 24 is a depression in the surface, which may be a counter-bore.

In an exemplary embodiment, a lower portion 23 of the void 2 tapers from the narrower medial portion 22 to a wider, lower surface opening 42 at the lower surface 41. In an exemplary embodiment, the taper is generally linear with an angle of taper c. In an exemplary embodiment, the void 2 may be formed by a process which provides a desired angle of taper c for a lower portion 23. In an exemplary embodiment, the angle of taper c will be at least as great as or greater than the angle predicted using simple Snell's law line calculations (Equation 4 below) for the refraction of electromagnetic radiation 7 incident on the surface of a lens 15 (FIG. 2C) to be defined in the surface 4 of the layer 1. The angle of taper c for the lower portion 23 may be selected to be, for example, from 0 degrees up to about 45 degrees.

In exemplary embodiment, the void 2 may be an orifice or nozzle in an orifice layer of a fluid emitter (FIG. 8), wherein the upper portion 24 is a counter-bore and the lower portion 23 is a bore hole. In an exemplary embodiment, the lower surface 41 of the layer 1 may define an upper boundary of a firing chamber (FIG. 8) in a fluid emitter, one example of which is an ink-jet print-head. The upper portion 21 may comprise a depression or other indentation, which may act as a counter-bore for a nozzle or orifice.

FIGS. 2A-2D illustrate an exemplary embodiment of a photo-resist etching process for forming the void 2 shown in FIG. 1. In an exemplary embodiment, the layer of photo-resist may comprise a negative-acting photo-resist, such as one sold by Microchem Corporation under the name SU8 (an epoxide photo-resist) or a dry film photo-resist, such as IJ 5000, which is manufactured by DuPont, or other suitable photoresitive film. The photo-resist can comprise any of a number of other negative photoresist materials that become insoluble in developing solutions after exposure to electromagnetic radiation including, for example, SINR-3170M, which is manufactured by Shin Etsu.

The layer may be prepared with a "soft bake" prior to processing, if desirable for a particular photo-resist. For example, a soft bake can be performed after application of a resist coating to remove solvent from the resist by evaporation; after the soft bake, the photo-resist comprises a solvent free thermoplastic. In an exemplary embodiment, the solvent-free thermoplastic comprises SU8 with a glass transition temperature of approximately 55° C. Other resists may have different glass transition temperatures. The glass transition temperature is the temperature at which polymer transforms from a solid to a viscous liquid. The glass transition temperature may also be defined by the temperature at which the slope of the specific volume increases in a plot of specific volume versus temperature for the photo-resistive material.

In FIG. 2A, the layer 1 is exposed to electromagnetic radiation 7 through a mask 8. The mask 8 may have non-transmissive portions 82 and transmissive portions 81. The transmissive portion 81 may be substantially transparent to the radiation 7 and the non-transmissive portion 82 may be substantially opaque to the radiant energy 7. Exposed portions 12, are exposed to sufficient radiation 7 such that they will be subject to cross-linking during a subsequent bake. The unexposed portions 11 are shielded from the radiation 7 by the non-transmissive portions and may not be subject to cross-linking during a subsequent bake.

In an exemplary embodiment, the exposure illustrated in FIG. 2A may be referred to as a "lens" exposure and the mask 8 used during the "lens" exposure may be referred to as a "lens" mask. This is because the exposure is used to define a lens 15 (FIGS. 2B, 2C) to be formed in the surface of the layer. The lens may be used at a later stage of processing to define an angle of a taper in the bore hole to be formed in the layer.

In an exemplary embodiment, the lens exposure may be performed, for example, using a NIKON 4425i wide field stepper using I-line radiation. In an exemplary embodiment, the exposing radiation may have a spectral peak of about 365.9+/−1.3 nm and may have a bandwidth at ½ the peak height of 6.5+/−1.2 nm. In other embodiments, the exposure may be performed using an SVG Micralign Model 760 exposure tool or other suitable device. In an exemplary embodiment, the electromagnetic radiation 7 is monochromatic. In other embodiments, the radiant energy can include energy over a broader spectral range. In an exemplary embodiment, SU8 is photo-reactive over a range of 300-380 nm. Other photoresists can be photo-reactive over other ranges of wavelengths.

In an exemplary embodiment, the layer may be exposed with the NIKON 4425i from about 100 msec. to 700 msec. In an exemplary embodiment, the layer may receive a dose in a range from about 50 mJ/cm$^2$ to about 350 mJ/cm$^2$.

In an exemplary implementation, the lens mask 8 may be a glass mask with a chrome reflective portion 82. In an exemplary embodiment, the mask is a projection mask, in which the radiant energy passes through a mask, through optics and is directed onto a wafer. In the case of a projection mask, the lens mask may be larger than the image of the mask projected onto the wafer. A projection mask may be a full wafer mask, for which the exposure pattern for the entire wafer is drawn on the mask, or a step-and-repeat mask, for which the exposure pattern for a portion of the wafer is drawn on the mask and the image projected through the mask is stepped across the wafer, exposing different portions of the wafer at different times. Any type of mask can be used that is operable with the particular photo-resist selected for a given implementation. In exemplary embodiments, the shape and size of the non-transmissive portions 82 may be selected to define lenses which may be used to define angled, tapered bore holes 23 (FIG. 1) in the layer.

The mask 8 permits the electromagnetic radiation 7 to pass through the transmissive portions 81 of the mask, thereby exposing a lens-exposure exposed portion 12 of the layer while leaving an as yet unexposed portion 11. The shape of the unexposed portion 11 of the photo-resist layer 1 is defined by the shape of the non-transmissive portion 82 of the mask where the radiant energy is blocked from reaching the layer. In an exemplary embodiment, the non-transmissive portion 82 has a substantially circular shape and a diameter in a range from about 15 um up to about 40 um.

Figure 5A:
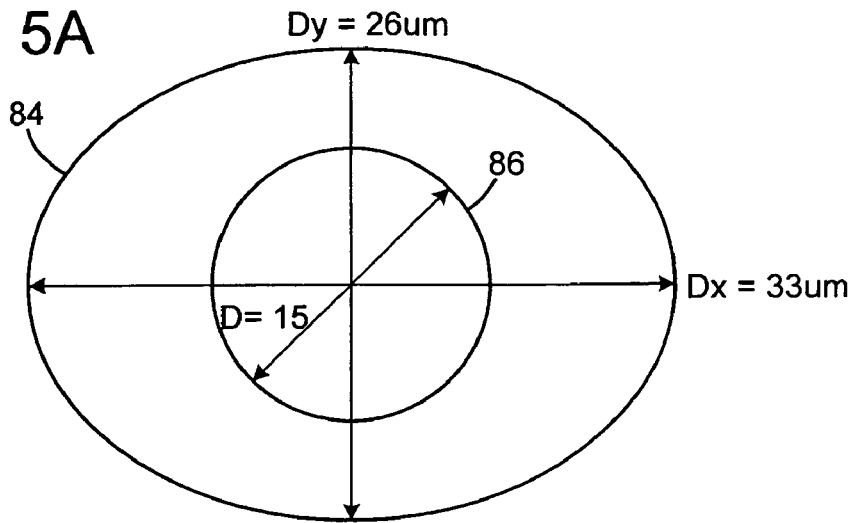
FIGS. 5A and 5B illustrate an exemplary embodiment of a process of forming non-axisymmetric bore-holes in a layer of photo-resist.

In an exemplary embodiment, the outline of the mask 8 in the x-y plane defines the shape, in the x-y plane, of the depression or lens to be formed in the surface of the void 2 to be formed. For example, where a non-circular feature is defined by the mask, then the shape of the lens in the x-y plane may be non-circular, for example elliptical as shown in FIG. 5A.

In an exemplary embodiment, the lens-exposure exposed portion 12 may receive a relatively low dose exposure to electromagnetic radiation 7, for example, for about 350 msec., or within a range of about 150-700 msec. in an embodiment using SU8 and a NIKON 4425i exposure tool. In an exemplary embodiment, the layer may receive an exposure dose of about 175 mJ/cm2 or in a range from about 75 mJ/cm2 to about 350 mJ/cm2.

In an exemplary embodiment, the layer may be exposed using a lithographic exposure tool. In a particular application or embodiment, the dose depends, in part, on the tool being used and/or the wavelength of the radiant energy, the photoresist being used, the efficiency of the photoactive element in the resist, the intensity of the electromagnetic radiation, time of exposure, the desired shape, depth and other features of the lens, counter-bore and bore to be formed. The desired conditions and parameters may be determined empirically based upon the above described parameters.

In an exemplary embodiment, the desirable conditions and parameters are chosen to result in a well-formed lens, the depth of which may be modulated by changing temperature of subsequent post exposure bake (PEB) bakes. For example, in the case of a layer of SU8 with a thickness in a range of about 5-50 um and an exposure for about 350 msec. using a NIKON 4425i (or an exposure dose of about 175 mJ/cm2), a PEB from about 85-120 deg. C. results in counter-bore depths of between 0.2 um and 3 um. In this exemplary embodiment, the photo-acid is believed to be generated in the exposed portions 12 whereas no photo-acid is formed in the unexposed portions 11. The amount of photo-acid generated is generally proportional to the exposure dose. The exposed portions 12 meet the unexposed portions 11 at an interface 14 in this exemplary embodiment.

In FIG. 2B, the exposed photo-resist layer 1 of FIG. 2A has been subjected to a PEB, during which cross-linking occurs in the lens-exposure exposed portion 12. Because cross-linking has occurred in the exposed portions 12, subsequent exposures and bakes will not appreciably affect the structure of those portions. In an exemplary embodiment, subsequent exposure (FIG. 2C) and PEB (FIG. 2D) may define the shape, size, and angle of taper c of a bore hole 23 (FIG. 1) to be formed in the as yet, unexposed portions 11.

In an exemplary embodiment, the PEB may be performed at 65 deg. C. for one minute and at 70-105 deg. C. for four minutes using a hotplate bake. The PEB may be performed, for example, using a DNS 80B bake track. In exemplary embodiments, the other temperatures and times may be used, and the temperature used may depend on the photo-resist being used. In an exemplary embodiment, the temperature of the PEB step controls the depth of the lens.

During the PEB, there may be a transition period after cross-linking commences. During the transition period, it is believed that the cross-linking matrix in the exposed portions 12 transforms from a viscous liquid, to a gel, and finally forms a cross-linked three dimensional molecular network. In an exemplary embodiment, a PEB can last for as long as about 5 minutes. It is believed, however, that many of the structural changes and the onset of cross-linking typically occur during the first several seconds of the bake. During this transitional period, the interface 14 may become an interface between two different materials, namely uncross-linked photo-resist in unexposed portion 11 and cross-linked resist in exposed portion 12, where the thermodynamic conditions for mixing are met.

The thermodynamic conditions for mixing may be met where the materials in region 11 and 12 are soluble in each other. The thermodynamic conditions are generally met where the PEB temperature is sufficiently high to permit diffusion of one or both of the materials across the interface 14. This is a balancing act between the temperature of the PEB and counter-bore exposure dose. Where the dose is too low, there may not be sufficient photo-acid produced in the polymer. This can result in little or very slow cross-linking in the exposed areas which in turn may result in an insignificant concentration gradient at the exposure interface which results in little or no diffusion across the interface. If the dose is too high, for example an exposure greater than about 700 msec. with a NIKON 4425i (or an exposure dose in excess of about 350 mJ/cm2), cross-linking can occur so quickly in a 90 deg. C. PEB that no depression/lens is formed.

In an exemplary embodiment, a lens or depression 15 forms in the surface of the photo-resist during a PEB. It is believed that this occurs, at least in part, due to diffusion 16 across the interface 14 from the unexposed portion 11 into the exposed portion 12. Diffusion can also result in a slight swelling in the surface of the layer at the interface.

In an exemplary embodiment, PEB temperatures are selected to create a relatively high diffusivity which decreases over time as the cross-link density increases during the PEB. The PEB temperatures at which sufficiently high diffusivity exists can be greater than the glass transition temperature, for example in a range of about 80 to 120 deg. C. As monomer is consumed by the cross-linking reaction, a concentration gradient is created at the exposure interface 14 (relatively large groups of assembled monomer versus small groups or single units of monomer) setting up the thermodynamic condition required for diffusion. The temperature can also be selected so that the monomer has sufficient energy to diffuse in the polymer matrix.

In an exemplary embodiment, suitable PEB temperatures are above the glass transition temperature and/or above the melting point of the photo-resist resin. The liquid polymer has relatively high diffusivity. As the photo-resist is heated, monomer is free to cross the exposure boundary in either direction. As time progresses during the PEB, the cross-linking reaction gels the exposed regions, making transport from exposed to unexposed areas more difficult. Transport of monomer from unexposed to exposed regions results in a net transport of monomer into the cross-linking matrix. This unbalanced transport of monomer results in a decrease in volume in unexposed regions.

In an exemplary embodiment, the depression 15 formed during the PEB has a shape corresponding to a catenary. It is believed that the depression 15 defines a catenary because it may be considered to have been formed as a meniscus of a liquid confined in a cylindrical volume; the liquid being the unexposed portions 11 when heated above the glass transition temperature during the PEB and the cylindrical volume being the volume defined by the cross-linked photo-resist in the exposed portions 12. In other embodiments, the shape of the volume may not be cylindrical if the shape of the mask during the lens expose step is not circular.

In an exemplary embodiment, the PEB for an SU8 photo-resist layer is conducted at a temperature within a range of about 80-120 deg. C. The temperatures should be selected to cause sufficient diffusivity at the interface 14 during the cross-linking transition period. Temperatures in the low end of a suitable range of temperatures may result in a depression with a shallower profile, whereas temperatures in the high end of a suitable range may result in a counter-bore with a deeper profile. In an exemplary embodiment, depressions as deep as about 3 microns are formed. The depth of the depression can be modulated by controlling or varying exposure dose, shape of the mask and bake temperature. As time progresses during the PEB, the crosslink density in exposed regions increases to a point where transport of the monomer is limited by steric hindrance and no further shape change can occur.

In exemplary embodiments with exposures for less than about 200 msec. with a NIKON 4425i (or exposure doses of less than about 100 mJ/cm2), counter-bore shapes formed in SU8 may be distorted. It is believed that the counter-bore shapes are distorted at low exposure doses because the concentration gradient of cross-linked material across the interface is not well defined, resulting in less net diffusion of material from the non-cross-linked side toward the cross-linking side of the transition. Distortion is also believed to be caused where the exposing energy in a low exposure dose is completely absorbed in the orifice layer resulting in insufficient exposure at the deeper end of the orifice.

In FIG. 2C, the photo-resist layer is exposed to electromagnetic radiation through a second mask 8'. In an exemplary embodiment, this exposure and mask may be referred to as a "bore hole" exposure, which may be referred to as a "bore hole mask." This is because the exposure and mask shown in FIG. 2C define the shape, profile and angle of taper c of a bore-hole 23 to be formed in the layer 1 (FIG. 1).

In an exemplary embodiment, the non-transmissive portion 82' of the bore hole mask is smaller than the non-transmissive portion 82 of the lens mask 8 (FIG. 2A). In an exemplary embodiment, the mask 8' is arranged to expose portions of the previously unexposed portions 11 (FIGS. 2A and 2B) of the layer 1. Those portions of the layer which were unexposed during a first exposure and which are exposed during a second exposure are represented as the bore-hole-exposure exposed portions 17 in FIG. 2C. Those portions that are unexposed during a prior exposure and remain unexposed during this exposure are represented as unexposed portion 11' in FIG. 2C. In an exemplary embodiment, the term "unexposed" refers to portions which are not exposed to electromagnetic radiation sufficient to reach the threshold for cross-linking in a subsequent PEB. In other words, it may be used to refer to portions of the layer which, although they are exposed to some radiation, the exposure does not reach the threshold necessary to create the conditions required for cross-linking in a subsequent PEB. Although the previously exposed portions 12 may also be exposed during this bore-hole exposure, they are not excluded from the "bore-hole" exposed portions 17, for convenience, because it may be desirable to further cross-link previously exposed portion 17 to improve the chemical resistance thereby improving the reliability of that region.

The outline of the mask 8' in the x-y plane may define the shape of the narrowest portion of the medial portion of the void to be formed. In an exemplary embodiment, the medial portion may have a narrowest diameter of about 6 um. In this exemplary embodiment, the second mask 8' is arranged such that, in the x-y plane, the unexposed portion 11' is encompassed by or enclosed within the partially exposed portion 17.

In an exemplary embodiment, the depression 15 in the surface of the layer 1 may act as a lens, refracting light incident on those portions of the layer that were unexposed in FIG. 2B. The light incident on the depression may refract due to the angle of incidence at the surface of the lens and due to the difference in the index of refraction of light through air and through the layer. In an exemplary embodiment, the electromagnetic radiation incident on the surface of the lens is refracted away from the unexposed portions of the layer.

As a result, the unexposed/exposed transition 14' tapers and widens down into the layer 1 from a narrowest portion corresponding to the shape and size of the non-transmissive portion of the mask 82'. In an exemplary embodiment, the unexposed portions 11' define a truncated conical shape. In an exemplary embodiment, the size and shape of the lens mask and the size and shape of the bore-hole mask are selected so that the angle of incidence of electromagnetic radiation at the exposure/non-exposure boundary, results in a predictable angle of taper in the bore hole.

In an exemplary embodiment, the exposure may be performed by a NIKON 4425i wide field stepper using I-line radiation and exposure times between 800-2000 msec. In an exemplary embodiment, the layer may receive an exposure dose in a range from about 400 mJ/cm2 to about 1000 mJ/cm2. In an exemplary embodiment, the exposure may subject the partially exposed portions 17 to a dose which is higher than the dose received by the exposed portions 12 in a prior exposure. In exemplary embodiments, the partially exposed portions receive a dose by exposure within a range from about 1000-3000 msec., for example about 1500 msec. or an exposure dose within a range from about 500 mJ/cm2 to about 1500 mJ/cm2, for example ablut 750 mJ/cm2. In an exemplary embodiment, the dose used to define the unexposed portion 11' is relatively higher than exposure energies in the first exposure of the portions 12, in order to limit diffusion of monomer from the unexposed portion 11' to the partially exposed portion 17 across the transition 14' during a subsequent PEB. This is believed to reduce distortion of the depression by providing for quicker cross-linking in the partially exposed portions, resulting in less diffusion from the unexposed portions to the partially exposed portions across the interface 14'. The total dose received by the exposed portions 12 during both exposures is greater than the total dose received by the partially exposed portions 17.

In FIG. 2D, the exposed photo-resist layer has been subjected to a PEB. In an exemplary embodiment, the PEB may be performed at a temperature of 65 deg. C. for about one minute and at 90 deg. C. for about four minutes using a hotplate bake. In an exemplary embodiment, the temperature of the PEB is in a range of about 80-120 deg. C., for example about 90 deg. C. Using too low of a temperature may increase the variability in the final product. Using too high of a temperature may generate undesirable stresses in the photo-resist. However, the particular temperatures used in a particular embodiment may depend on the materials being used, the structures being formed and the applications for which the products are to be used.

Cross-linking may occur in the bore-hole exposed portions 17 during the PEB. Diffusion 16' may also occur across the transition 14' causing a depression 15' at the upper surface of the unexposed portions 11. In an exemplary embodiment, the cross-linked material in the bore-hole exposed portion 17 along the transition 14' defines the boundaries of interior walls of the bore hole or lower portion of the void to be formed in a subsequent develop process.

Figure 8:
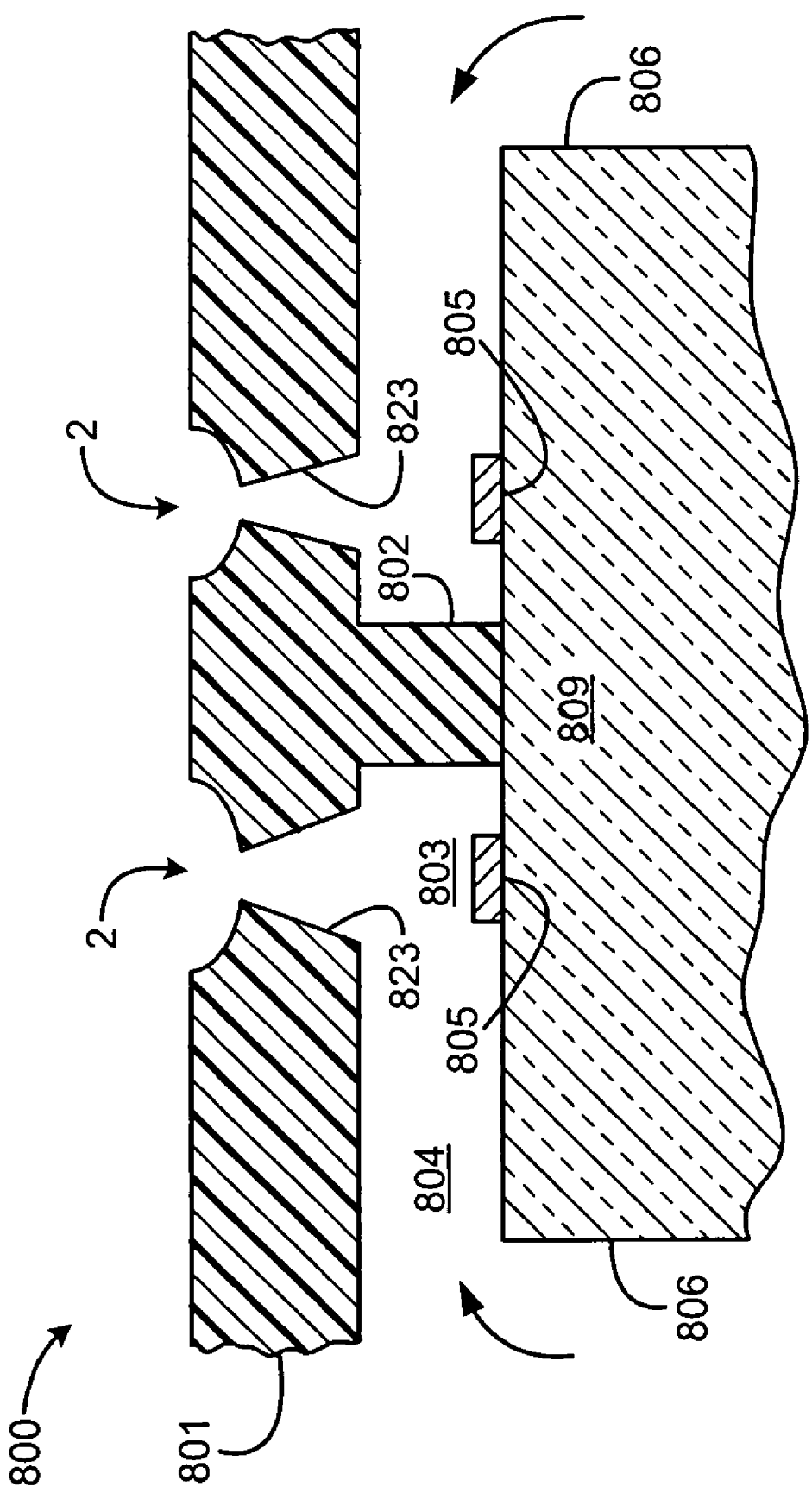
FIG. 8 illustrates an exemplary embodiment of a fluid emitter with an orifice layer having tapered bore-holes.

In an exemplary embodiment, the layer 1 may be developed, for example using a solvent. In an exemplary embodiment, the solvent comprises at least one of ethyl lactate, diacetone alcohol or n-methyl-2-pyrrolidone or other solvent suitable for the particular photo-resist being used. The solvent removes the unexposed portions 11', leaving the void 2 in the photo-resist layer 1 as shown in FIG. 1. In an exemplary embodiment, the layer 1 is disposed on top of a layer of other material during processing. In an exemplary embodiment, the layer of other material is positioned in spaces in the barrier layer of a fluid emitter, for example material 94 filling the space where a firing chamber of a fluid emitter is to be formed (FIG. 8). The material 94 is soluble in a solvent and can be removed during development (FIG. 6B).

It is appreciated by those of skill in the art that, in this and other embodiments, the dose absorbed by a portion of photo-resist may be the effective dose, namely radiant energy sufficient to generate sufficient photo-acid to create the conditions for forming the structures described herein. The effective dose may not be the total dose of energy incident on the photo-resist based on the intensity of the radiant energy. For example, where a photo-resist is more reactive to light in certain wavelength range and less reactive to light in another wavelength range, the effective dose can be determined by the distribution of radiation intensities throughout the range of wavelengths that generate photo-acid. For a given amount of radiant energy, a distribution that is weighted with more energy in wavelengths which generate greater amounts of photo-acid will provide a greater effective dose than a distribution which is weighted less heavily with photo-acid generating wavelengths. The dose, or effective dose, sufficient to generate sufficient photo-acid to create the desired void-forming conditions can be provided by any wavelength distribution that generates the desired amount of photo-acid. Increasing the dose may mean increasing the intensity of photo-acid generating wavelengths in any of these distributions. A particular wavelength distribution can be achieved by wavelength filtering a particular source of radiation or tuning the output of the source or selecting a different source.

FIG. 3 illustrates a cross-section of an exemplary photo-resist layer after formation of a depression 15 or lens in the surface 4 of the layer 1. In an exemplary embodiment, the surface of the depression 15 defines a catenary which may be described by the following set of parametric equations:

$$X(r)=r \quad \text{Equation 1}$$

$$Y(r)=a \cos h(r/a) \quad \text{Equation 2}$$

$$\Theta(r)=2 \tan [\tan h9r/2a)] \quad \text{Equation 3}$$

(r=0 corresponds to the vertex or minima of the catenary; a describes the width and depth of the catenary, y(r) defines the depth of the catenary with respect to the position r and $\Theta(r)$ defines the angle of the tangent to the catenary at position r).

In an exemplary embodiment, the depression 15 may have a diameter D of about 33 um (the size of which was defined by the size of a lens mask) and which is about 3.7 um deep (the depth of which may be controlled by controlling the PEB time and temperature). In an exemplary embodiment, the layer has cross-linked, exposed portions 12 and non-cross-linked, unexposed portions 11, resulting from a lens exposure and a lens PEB. In an exemplary embodiment, the layer 1 is to be further processed to form a tapered bore hole with an opening having a diameter D' of about 14.5 um tapering to wider widths further into the bore hole.

In an exemplary embodiment, the angle of incidence $\Gamma$ of the electromagnetic radiation at the exposure/non-exposure boundary during a subsequent bore-hole exposure may be determined from the equations given above. In the example given, the angle of incidence $\Gamma$ may be calculated to be about 11.1 degrees.

With the angle of incidence known, a simple Snell's law calculation and simple line tracing may be used to calculate and illustrate a nominal, minimum expected taper angle c. FIG. 3 illustrates simple line-tracings based on Snell's law illustrates the predicted refraction of light away from vertical for light incident on the lens.

Lines 71 illustrate the electromagnetic radiation incident on the lens at the inner-most edges at the surface of those portions to be exposed through a mask. In an exemplary embodiment, the radiation 71 is incident on an angled surface of the lens at an angle $\Gamma$, where $\Gamma$ represents the angle between the radiation 71 and a line 91 perpendicular to a tangent 9 of the surface where the radiation is incident on the surface. In an exemplary embodiment, the angle Γ may be described by the relationship:

$$n_1 \sin(\Gamma) = n_2 \sin(b)$$ Equation 4 where n1 is the index of refraction of light in air (n1=1), n2 is the index of refraction of SU8 (n2=1.67 at 365 nm), Γ is the incident angle of light and b is the angle at which light is refracted in SU8.

In FIG. 3, the surface of the lens is shown as an inclined surface whose angle of inclination relative to the surface perpendicular to the optical axis of the incident light is Γ. The value of Γ as computed above, by equation 3 (based on the known, catenary shape of the surface of the lens), resulted in Γ=11.1 degrees. Equation 4 results in b=6.6 degrees. The angle b is the angle between the line perpendicular to the lens surface and the refracted light; however, the Snell's law calculated taper angle c is defined as the angle away from perpendicular (the angle c').

In an exemplary embodiment, the result may be that c'=(Γ−b) or c'=4.5 degrees. As a result, those portions of the layer falling inboard of the Snell's law calculated angle may not be exposed to radiation through the mask and the "unexposed portions 11'" (FIGS. 2C and 2D) (in other words those portions that are not exposed to radiation sufficient to create the conditions for cross-linking in a subsequent bake) will have an angle of taper at least as great as the calculated angle c'.

In an exemplary embodiment, the angle of taper c of a bore hole may be greater than the Snell's-law-calculated angle c'. In FIG. 3, dashed line 14' illustrates an exemplary exposed/non-exposed boundary, similar to the one illustrated in FIGS. 2C and 2D, where the boundary designates those portions which may be exposed to sufficient radiation so that they are susceptible to cross-linking in a subsequent bake.

The actual taper may be greater for a variety of reasons. For example, a taper of about 2-6 degrees may be achieved by varying the focus offset during exposure of a nozzle in a nozzle forming process using only one nozzle mask. In other words, a taper of about 2 degrees to 6 degrees may be achieved due to focus offset alone during a single exposure, without using multiple exposures. Using focus offset in conjunction with a multi-exposure process may increase the amount of taper beyond that calculated using the Snell's law calculation, for example by as much as about another 2-6 degrees beyond that calculated, or to about 6.5 to 12.5 degrees.

In the Snell's law calculation and illustration, it was merely assumed that the light at the exposure/non-exposure interface was projected through the SU8 at its full intensity, which is selected to exceed the threshold exposure to result in cross-linking in a subsequent PEB. In an exemplary embodiment, the intensity of the radiation and resultant exposure of the photo-resist within the layer may be less than full intensity because of differing amounts of diffraction along the lens and from lower intensity deeper within the layer due to absorption of radiation within the layer during penetration. In an exemplary embodiment dye may be introduced in the photo-resist to create an intensity gradient within the layer to control the amount of absorption-induced taper. As a result, the angle of taper of a bore-hole may be greater than predicted by Snell's law alone and bigger than expected based on Snell's law and taking into account the focus offset. The angle of taper may also be greater due to offset focus effects described and illustrated below, with respect to FIG. 4.

Lines 72 and 73 illustrate Snell's law line tracings for radiation or light incident on the lens at points outboard of the light represented by line 71. The respective angles of incidence r2 and r3, are each progressively larger, resulting in progressively larger angles of diffraction away from the z axis. Because the light rays are diffracted away from each other, the intensity of the radiation within the layer and deeper into the layer is less than full intensity incident on the surface.

In an exemplary embodiment, the exposing energy may be qualitatively described by an intensity distribution which starts at zero and increases to a maximum at some distance away from the projected nozzle edge. In an exemplary embodiment, the intensity of the radiation may reach a maximum at some distance away from the projected nozzle edge.

Figure 4:
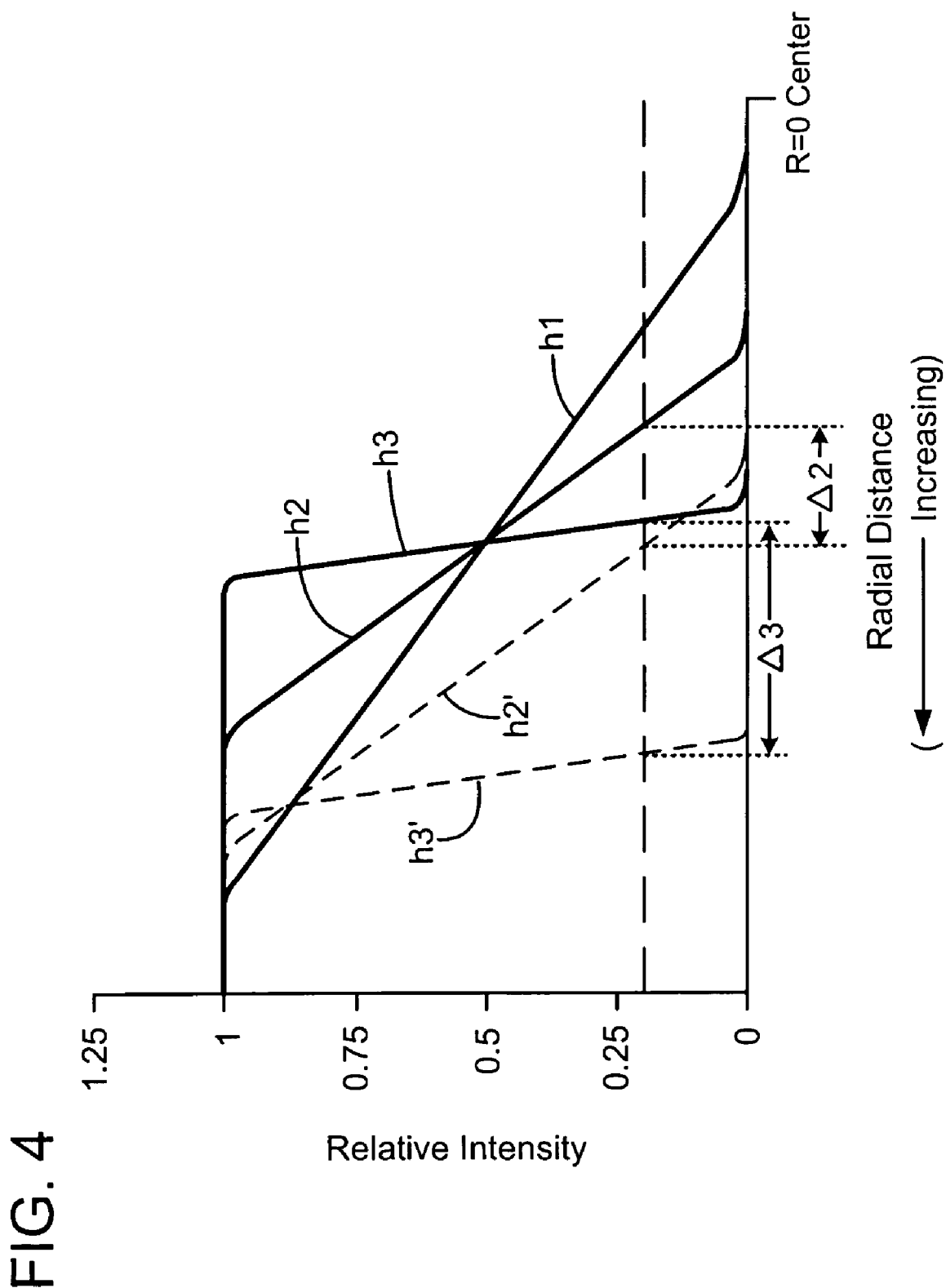
FIG. 4 illustrates the relative intensity of radiation at various depths in an exemplary layer of photo-resist exposed to radiation.

FIG. 4, for example, illustrates the intensity of exposing light sketched schematically at three depths h1, h2 and h3 within the SU8 layer where h1 is at the top surface of the layer and h2 and h3 are at progressively deeper positions within the layer. Each curve represents the intensity of exposing radiation as a function of radial position at the corresponding depth in the layer. The center of the orifice being created is at the nozzle center R=0 and radial distance from the center increases to the left along the x-axis. The radial distance increases as the curves move away from the center.

Each curve h1, h2 and h3 represents the intensity of the exposure energy as a function of horizontal, radial position. Each curve is taken at a discrete vertical position. When a high positive focus offset is used, the edge being patterned is out of focus at the film surface and so has a gradual horizontal transition from full intensity to no intensity (h1). Moving deeper into the layer, the edge becomes more focused and the curve has a correspondingly steeper horizontal transition from full intensity to no intensity (h2). At some depth in the film, the edge is at best focus, which results in the steepest horizontal transition from full intensity to no intensity (h3). Taper is induced by the change in horizontal placement of the edge as a function of depth. The intersection of focus (i.e. depth) dependent intensity curves and the cross-link threshold line shown in the figure determine horizontal placement of the edge.

Where a lens is present in the surface of the material during imaging of this edge, then the horizontal placement of the edge being imaged is still a function of depth into the film, but is also a function of the lens characteristics. A concave lens will change the angle of edge over the depth of the film, thus inducing more taper than would be achieved by offset focus alone. Curves h2' and h3', for example, illustrate the increase in radial position for an exposure to cross the cross-link threshold at the depths corresponding to curves h2 and h3, respectively. At the depth corresponding to h2', for example, the radial position at which the edge of the tapered orifice is defined has increased by A2. At the depth corresponding to h3', for example, the radial position at which the edge of the tapered orifice is defined has increased by A3. The corresponding increased orifice radii at the progressively deeper depths result in a greater angle of taper for the bore formed by the exposure.

Figure 5B:
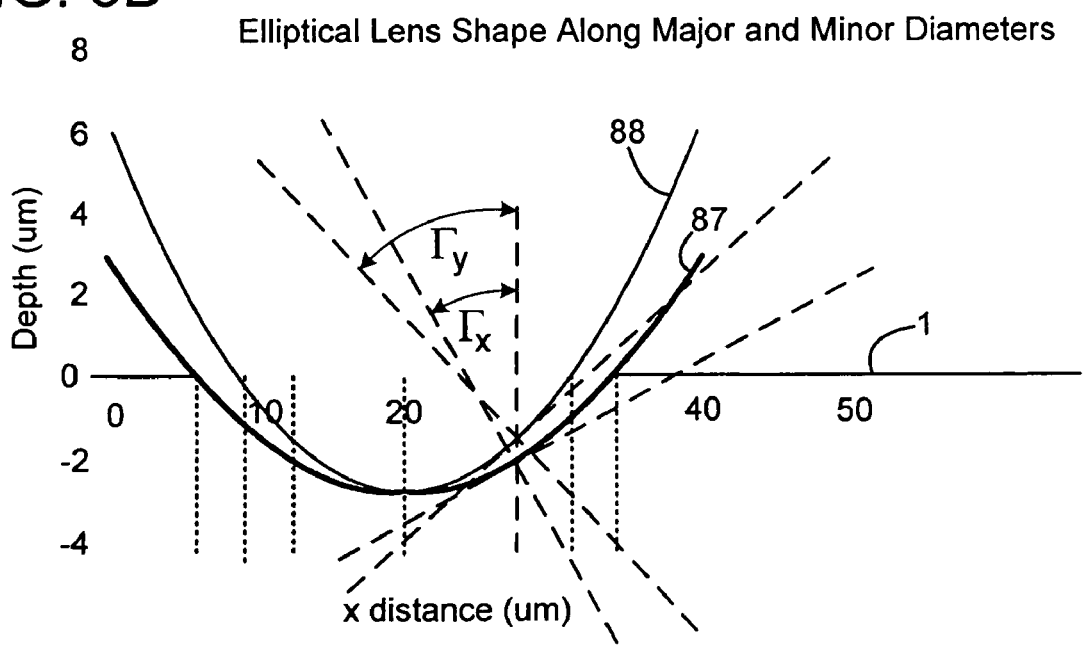

FIGS. 5A and 5B illustrate an exemplary embodiment of a process for manufacturing an orifice with a non-axisymmetric tapered bore. In an exemplary embodiment, a layer may be exposed through a lens mask to define an unexposed portion having a non-circular shape 84, for example an oblong or elliptical shape as shown in FIG. 5A. In an exemplary embodiment, a depression may form in the portion of a surface of the exposed layer which has a shape in the x-y plane corresponding to the unexposed portions of the layer. In an exemplary embodiment, a depression or lens may form in the surface of the layer during a PEB conducted after the lens exposure through the lens mask. The depth of the depression may be controlled by the temperature and time of the PEB.

In an exemplary embodiment, the lens may have a major diameter Dx of 33 um and a minor diameter Dy of 26 um. The lens shape or profile along the major and minor axes of the exposing ellipse may be predicted or described using Equations 1 and 2. The depth of the depression or lens formed may be controlled by the temperature and time of a PEB after the lens exposure.

FIG. 5B illustrates the curve of the surface of the depression along the x-axis and y-axis directions. In an exemplary embodiment, the depression defines a catenary 87 along the x-axis that is less steep and wider than a catenary 88 defined by the surface of the depression along the y-axis. Assuming a 3.7 um lens depth and using the same procedure used above to estimate the taper for a 15 um diameter nozzle we find that lens is inclined at a 11.4 degree angle in the X axis and 18.1 degree angle in the Y axis or that the predicted taper angles are 4.6 and 7.4 degrees respectively. If a more complex variation in taper angle as a function of position around the bore is desired, the appropriate lens mask should be created using the above principles as guidance.

In an exemplary embodiment, layer 1 may be subject to a bore-hole exposure through a bore-hole mask having a shape 86 that is different from the shape of the lens mask, for example a circular shape as shown in FIG. 5A. FIG. 5B illustrates the difference in angles of incidence ($\Gamma x$, $\Gamma y$) of the light from the bore-hole exposure on the surface of the lens at points along the x-axis and y-axis. In an exemplary embodiment, the angles of incidence are greater where the circular bore-hole exposure radiation strikes the surface along the y axis than where the radiation strikes the surface along the x-axis. As a result, the bore-hole exposed portion, defined during a bore-hole exposure, has a greater taper angle along the y-axis than the x-axis. In an exemplary embodiment, the taper angle varies continuously from steeper to narrower with angular position around the bore hole. It is understood that different-shaped masks and different combinations and permutations of mask shapes may result in a variety of taper profiles and that the mask shapes and combinations of mask shapes and sizes may be selected to result in desired taper profiles, taper angles and bore-hole sizes.

In an exemplary embodiment, varying the taper as a function of angular position around the perimeter of a single bore hole may be used to pre-bias a nozzle of a fluid emitter to emit a droplet in a specific direction.

Figure 6:
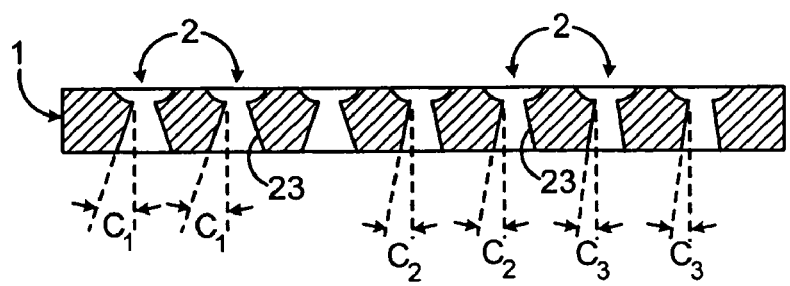
FIG. 6 illustrates an exemplary embodiment of a layer with multiple bore-holes with differing angles of taper.

FIG. 6 illustrates an exemplary embodiment of a layer 1 having a series of different taper angles (c1, c2, c3) for bore holes 23 across the same layer 1. In an exemplary embodiment, the bore holes 23 may arranged as at least portions of nozzles 2 across a fluid emitter. In an exemplary embodiment, this feature may be used for providing multiple drop weight architectures. The angles of taper (c1, c2, c3), combined with various resistor sizes and orifice sizes, may be tuned to provide a desired drop weight for drops emitted from one nozzle and different drop weights for other nozzles. Multiple drop weight architectures on a single printhead enable smoother color transitions without the introduction of additional inks, which may reduce grain and improve image quality. Using smaller or larger drops of the same ink (instead of same-size drops of different inks with a lighter or darker shade) may make the printer more cost effective. Paper saturation, cockle and bleed from ink may also be greatly reduced, as less ink volume is used to produce the lighter shades.

Figure 7:
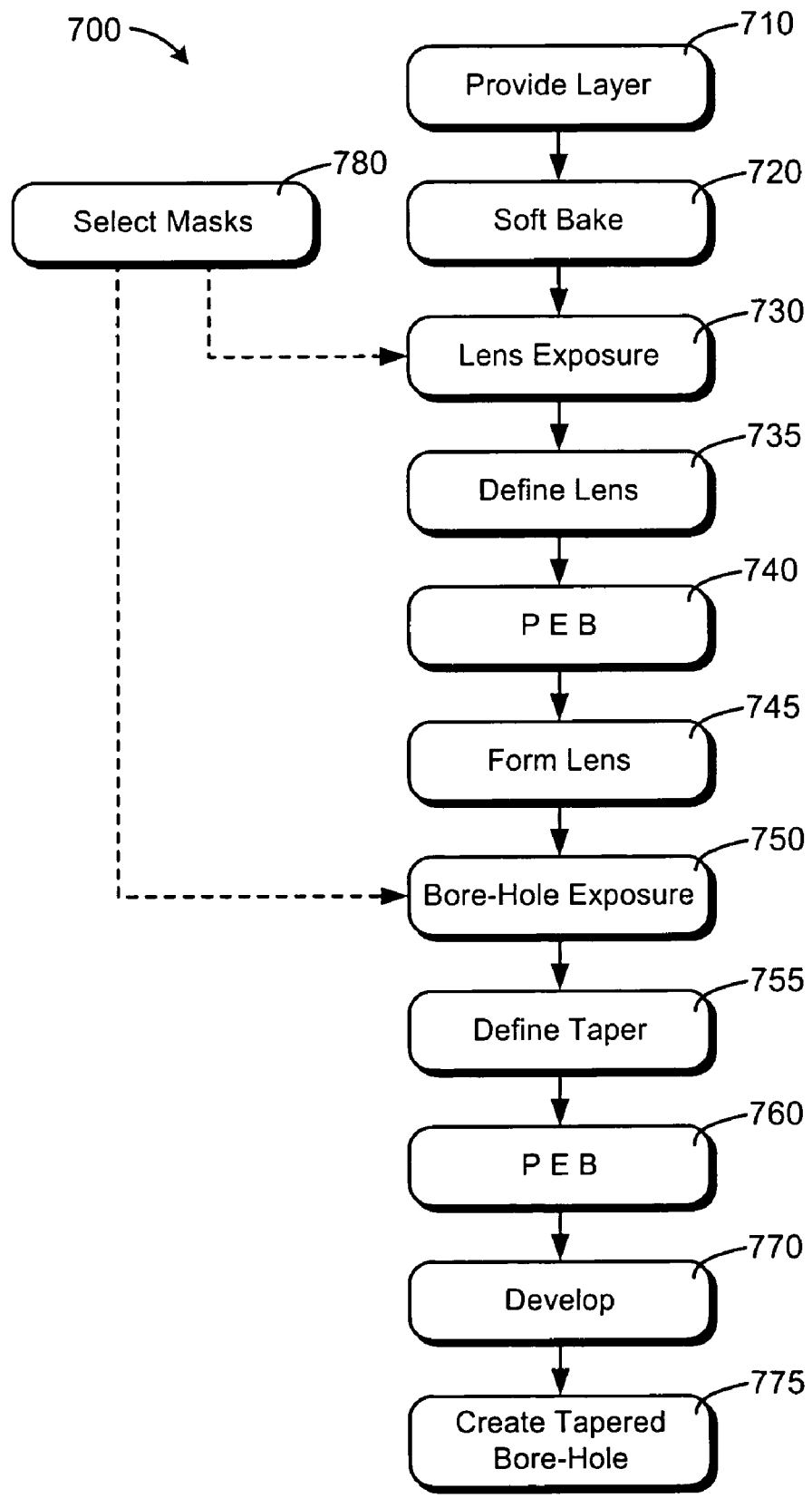
FIG. 7 illustrates an exemplary embodiment of a process for forming tapered bore-holes.

FIG. 7 illustrates a block flow diagram of an exemplary embodiment of a process 700 for forming a tapered bore-hole in a layer of photo-resist. The process may include first providing 710 a layer of photo-resist. The layer of photo-resist may be subjected to a "soft bake" 720 which may provide a solvent-free photo-resist.

The layer may be exposed 730 to electromagnetic radiation through a mask to define 735 the size of lenses to be formed in the surface of the layer.

The exposed layer may be subjected to a PEB 740 to cross-link exposed portions of the resist and to form 745 a lens in the surface of the unexposed portions of the layer. In an exemplary embodiment, the parameters of the PEB may determine the depth of a lens formed in the surface of the unexposed portions.

The layer may be exposed 750 through a mask, wherein the exposure exposes portions of the previously unexposed portions and leaves portions of the previously unexposed portions further unexposed. In an exemplary embodiment, the exposure through the mask, in conjunction with the shape of the lens, defines 755 a tapered, unexposed portion.

The layer may be subjected to a PEB 760 to cross-link the exposed portions and define the shape of a tapered bore hole to be formed in the layer.

The layer may be developed 770 using a solvent to remove the unexposed portions and create 775 a tapered bore-hole, the shape of which corresponds to the shape of the unexposed portion defined at step 755.

In an exemplary embodiment, the lens mask and bore-hole mask are selected 780 to result in desired tapers for bore holes to be formed. In an exemplary embodiment, selecting 780 may include selecting shapes, such that the angles of incidence of radiation on a surface of a lens formed in the surface of the layer result in desired angles of taper in bore holes to be formed. In an exemplary embodiment, the masks are selected to provide shapes which result in non-axisymmetric tapered bore-holes. In an exemplary embodiment, the masks are selected to provide multiple bore-holes in a layer. In an exemplary embodiment, various boreholes may have sizes, tapers, and/or non-axisymmetric taper profiles that differ from those of other bore-holes.

FIG. 8 illustrates an exemplary embodiment of a fluid emitter. The fluid emitter 800 includes a barrier layer 802 and an orifice layer 801. In an exemplary embodiment, the barrier layer 802 defines a firing chamber 803 and fluid chambers 804. A firing resistor 805 may be located within the firing chamber. The orifice layer defines voids 2 or orifices having tapered bore holes 823. The tapered bore holes 823 may be formed by a process described in this disclosure. The tapered bore holes 823 may be circular, non-circular, non-axisymmetric and may have properties, such as size, taper and angular variation of taper, which differ from other orifices in the orifice layer. Fluid, for example ink, may be channeled through a fluid feed slot 806 and the fluid channels 804 to the fluid chambers 803. The firing resistor 805 may be formed on a substrate 809, for example a silicon substrate, and may be energized to emit fluid through the orifices. In an exemplary embodiment, the size, taper, and angular taper variations may be arranged to provide a desired parameter or parameters for emitted fluid including, for example, the size, directionality and speed of an emitted drop of fluid. In an exemplary embodiment, various orifices and bore-holes may have differing sizes, tapers or angular taper variations for producing drops with different parameters across the fluid emitter.

Figure 9:
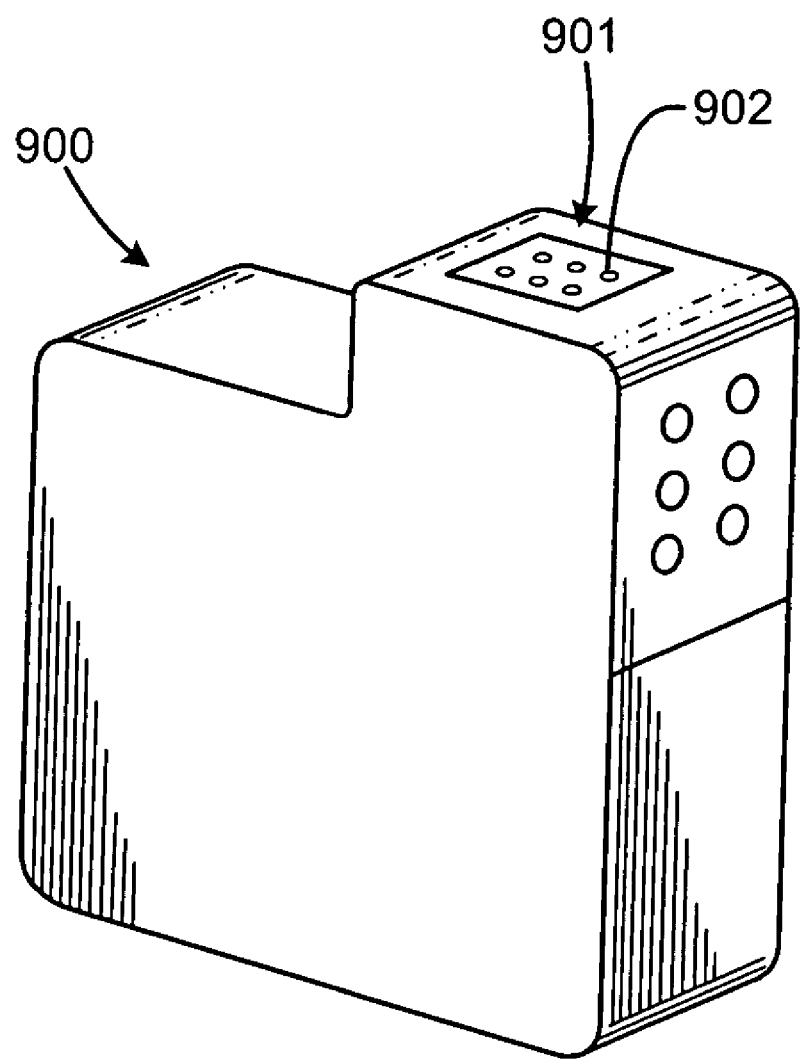
FIG. 9 illustrates an exemplary embodiment of a fluid emitter cartridge.

In an exemplary embodiment, the fluid emitter may be a printhead and may be included on a printer cartridge. FIG. 9 illustrates an exemplary embodiment of a fluid emitter cartridge 900, for example a printer cartridge, suitable for use in a printer. The printer cartridge 900 has a fluid emitter 901, for example a printhead, arranged to emit fluid, for example ink, through orifices 902. In an exemplary embodiment, the orifices 902 include tapered bore-holes. The cartridge may include a reservoir of fluid to be ejected from the emitter.

It is understood that the above-described embodiments are merely illustrative of the possible specific embodiments which may represent principles of the present invention. Other arrangements may readily be devised in accordance with these principles by those skilled in the art without departing from the scope and spirit of the invention.

What is claimed is:

1. A method of forming a tapered bore-hole in a layer of photo-resist, comprising:
    forming a lens in a surface of a first unexposed portion of the layer;
    exposing the first unexposed portion through a bore-hole mask to define an exposed portion and a second unexposed portion, wherein the second unexposed portion has a tapered shape;
    baking the layer to cross-link the exposed portion;
    developing the layer to remove the second unexposed portion to form a tapered bore hole having a shape corresponding to the tapered shape,
    wherein the lens is adapted to define a desired angle of taper of the tapered bore hole.

2. The method of claim 1, wherein forming a lens in a surface of a first unexposed portion comprises exposing the layer through a lens mask to define a first exposed portion and the first unexposed portion.

3. The method of claim 2, wherein exposing the layer comprises exposing the layer to I-line electromagnetic radiation.

4. The method of claim 2, wherein exposing the layer comprises exposing the layer with an exposure dose from about 50 mJ/cm2 to about 350 mJ/cm2.

5. The method of claim 1, wherein forming a lens comprises exposing the layer through a lens mask to define a first exposed portion and the first unexposed portion and baking the layer to cross-link the first exposed portion and to form a depression in a surface of the layer.

6. The method of claim 5, wherein exposing the layer comprises exposing the layer to I-line electromagnetic radiation.

7. The method of claim 5, wherein exposing the layer comprises exposing the layer to an exposure dose within a range from about 50 mJ/cm2 to about 350 mJ/cm2.

8. The method of claim 5, wherein baking the layer to cross-link the first exposed portion comprises baking the layer at about 65 deg. C. for about one minute and at a temperature in a range from 70 deg. C. to about 120 deg. C. for about four minutes.

9. The method of claim 5, wherein baking the layer to cross-link the first exposed portion comprises baking the layer on a hot plate.

10. The method of claim 1, wherein baking the layer to cross-link the exposed portion comprises baking the layer at about 65 deg. C. for about one minute and at about 90 deg. C. for about four minutes.

11. The method of claim 1, wherein baking the layer to cross-link the unexposed portion comprises baking the layer on a hotplate.

12. The method of claim 1, wherein exposing the first unexposed portion comprises exposing the layer through a bore-hole mask with I-line electromagnetic radiation.

13. The method of claim 1, wherein exposing the first unexposed portion comprises exposing the layer through a bore-hole mask with I-line radiation with an exposure dose in a range from about 400 mJ/cm2 to about 1000 mJ/cm2.

14. The method of claim 1, wherein developing the layer comprises developing the layer using a solvent.

15. The method of claim 1, wherein developing the layer comprises developing the layer using one of ethyl lactate, diacetone alcohol or n-methyl-2-pyrrolidone.

16. The method of claim 1, wherein the tapered shape has a taper angle greater than a taper angle predicted by Snell's law.

17. The method of claim 1, wherein the tapered shape has a taper angle in a range from about 0 degrees to about 45 degrees.

18. The method of claim 1, wherein the tapered shape has a taper angle greater than 5 degrees.

19. The method of claim 1, wherein the tapered shape has a taper angle greater than 10 degrees.

20. The method of claim 1, wherein the tapered shape has a taper angle greater than 15 degrees.

21. A method for forming a tapered bore-hole, comprising:
    providing a layer of photo-resist;
    soft-baking the layer of photo-resist;
    exposing the layer of photo-resist through a lens mask to define a first exposed portion of the layer and a first unexposed portion of the layer, the first exposed portion of the layer being a lens;
    baking the layer of photo-resist to crosslink the first exposed portion and to form a lens at a surface of the first unexposed portion;
    exposing the first unexposed portion of the layer through a bore-hole mask to define a second exposed portion of the layer and a second unexposed portion of the layer;
    baking the photo-resist layer to cross-link the second exposed portion;
    developing the layer to substantially remove the second unexposed portion and to form a bore-hole in the layer;
    wherein the bore-hole has a tapered shape with a desired angle of taper greater than an angle of taper predicted using Snell's law, and
    wherein the lens is adapted to define the desired angle of taper of the bore-hole.

22. A method for forming non-axisymmetric tapered bores in a layer of photo-resist comprising:
    exposing a layer of photo-resist through a lens mask to define a first exposed portion and a first unexposed portion, wherein the first unexposed portion defines a first shape at a surface of the layer, the first exposed portion of the layer being a lens;
    baking the layer to cross-link the first exposed portion and to form a depression in a surface of the first unexposed portion;
    exposing the unexposed portion through a bore-hole mask to define a second exposed portion and a second unexposed portion, wherein the second unexposed portion defines a second shape at the surface of the layer;
    baking the layer to cross-link the second exposed portion;
    developing the layer with a solvent to remove the second unexposed portion to form a tapered bore hole;
    wherein at least one of the first or second shapes is a non-axisymmetric shape, and
    wherein the lens is adapted to define a desired angle of taper of the tapered bore hole.

23. The method of claim 22, wherein the first shape is an ellipse and the second shape is a circle.

24. The method of claim 22, wherein an angle of incidence for radiation incident on the surface of the layer at an inner edge of the second exposed portion varies with angular position around the inner edge of the second exposed portion.

25. A method for forming non-axisymmetric tapered bores in a layer of photo-resist comprising:
  exposing a layer of photo-resist through a lens mask to define a first exposed portion and a plurality of first unexposed portions within the first exposed portion, the first exposed portions of the layer being lenses;
  baking the layer to cross-link the first exposed portion and to form a depression at a surface of each of the plurality of first unexposed portions;
  exposing the plurality of unexposed portions through a bore-hole mask to define a plurality of second exposed portions and a plurality of second unexposed portion, at least one second unexposed portion within each of the plurality of second exposed portions;
  baking the layer to cross-link the plurality of second exposed portions;
  developing the layer with a solvent to remove the second unexposed portions to form a plurality of tapered bore holes,
  wherein the lenses are adapted to define a desired angle of taper of the bore holes.

26. The method of claim 25, wherein an angle of taper of a first bore-hole is greater than an angle of taper for a second bore-hole.

27. The method of claim 25, wherein the plurality of first unexposed portions each define non-axisymmetric shapes at a surface of the layer and the plurality of second unexposed portions each define circles at the surface of the layer.

28. The method of claim 25, further comprising selecting a lens mask for defining non-axisymmetric first unexposed portions.

29. The method of claim 28, further comprising selecting a bore-hole mask for defining circular second unexposed portions.

* * * * *